(12) United States Patent
Tadokoro et al.

(10) Patent No.: US 9,899,243 B2
(45) Date of Patent: Feb. 20, 2018

(54) LIGHT IRRADIATION APPARATUS

(71) Applicant: Tokyo Electron Limited, Tokyo (JP)

(72) Inventors: Masahide Tadokoro, Kumamoto (JP);
Yuichi Terashita, Kumamoto (JP);
Gousuke Shiraishi, Kumamoto (JP);
Tomohiro Iseki, Kumamoto (JP);
Masaru Tomono, Kumamoto (JP);
Hironori Mizoguchi, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 244 days.

(21) Appl. No.: 14/962,133

(22) Filed: Dec. 8, 2015

(65) Prior Publication Data
US 2016/0170316 A1   Jun. 16, 2016

(30) Foreign Application Priority Data

Dec. 15, 2014   (JP) .................................. 2014-253428

(51) Int. Cl.
*G03B 27/54* (2006.01)
*H01L 21/67* (2006.01)
*G03F 7/20* (2006.01)

(52) U.S. Cl.
CPC .... *H01L 21/67115* (2013.01); *G03F 7/70991* (2013.01)

(58) Field of Classification Search
CPC ............ G03F 7/70991; G03F 7/70091; H01L 21/67115
USPC .......................................................... 355/67
See application file for complete search history.

(56) References Cited

FOREIGN PATENT DOCUMENTS

JP   2009-111050 A   5/2009

*Primary Examiner* — Peter B Kim
(74) *Attorney, Agent, or Firm* — Abelman, Frayne & Schwab

(57) ABSTRACT

A light irradiation apparatus includes: a rotary holding unit that rotates a substrate around a rotary axis while holding the substrate; a lighting unit positioned to face the rotary holding unit; a light shielding mask positioned between the rotary holding unit and the lighting unit, and widened along a direction orthogonal to the rotary axis; and a driving unit that linearly moves the lighting unit along the direction orthogonal to the rotary axis. The light shielding mask overlaps with the substrate when viewed in the direction of the rotary axis. The light shielding mask has an opening portion. An opening width of the opening portion at a side away from the rotary axis is larger than the opening with near the rotary axis. The lighting unit irradiates light through the opening portion toward the surface of the substrate while being moved above the opening portion by the driving unit.

8 Claims, 13 Drawing Sheets

LIGHT IRRADIATION APPARATUS

CROSS-REFERENCE TO RELATED APPLICATIONS

This application is based on and claims priority from Japanese Patent Application No. 2014-253428, filed on Dec. 15, 2014, with the Japan Patent Office, the disclosure of which is incorporated herein in its entirety by reference.

TECHNICAL FIELD

The present disclosure relates to a light irradiation apparatus.

BACKGROUND

In a semiconductor manufacturing process, there is a case in which a light (radiation) such as, for example, ultraviolet ray, is irradiated to a surface of a substrate. This is performed for the purpose of, for example, modifying the surface of the substrate, heating the substrate, facilitating a chemical reaction in a resist film formed on the surface of the substrate, and removing organic matter existing on the surface of the substrate.

Japanese Patent Laid-Open Publication No. 2009-111050 discloses a substrate processing apparatus configured to irradiate ultraviolet ("UV") rays to a surface of a substrate. The substrate processing apparatus includes: a substrate holding table configured to hold a substrate that has a resist pattern formed on the surface thereof; a UV lamp positioned above the substrate holding table and configured to irradiate UV lays to the surface of the substrate on the substrate holding table; and a moving mechanism configured to move the substrate holding unit parallel to the UV lamp. The UV lamp is a line light source having a linear shape, and extends to be substantially orthogonal to the moving direction of the substrate holding table. The length of the UV lamp is larger than the width of the substrate in the direction orthogonal to the moving direction of the substrate holding table. Therefore, UV rays are irradiated to the whole surface of the substrate merely by moving the substrate holding table linearly in a predetermined direction below the UV lamp. This is a portion of a processing for smoothing the resist pattern on the surface of the substrate.

SUMMARY

A light irradiation apparatus according to an aspect of the present disclosure includes: a rotary holding unit configured to rotate a substrate around a rotary axis extending in a direction orthogonal to a surface of the substrate while holding the substrate; a lighting unit positioned to face the rotary holding unit; a light shielding mask positioned between the rotary holding unit and the lighting unit, and widened along a direction orthogonal to the rotary axis; and a driving unit configured to linearly move the lighting unit along the direction orthogonal to the rotary axis. The light shielding mask overlaps with the substrate to cover the surface of the substrate held on the rotary holding unit, when viewed in the direction of the rotary axis. The light shielding mask has an opening portion that extends toward an outside from the rotary axis in the direction orthogonal to the rotary axis, and an opening width of the opening portion at a side away from the rotary axis is larger than the opening width near the rotary axis in the direction orthogonal to the rotary axis. The lighting unit irradiates light through the opening portion toward the surface of the substrate held on the rotary holding unit while being moved above the opening portion by the driving unit.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
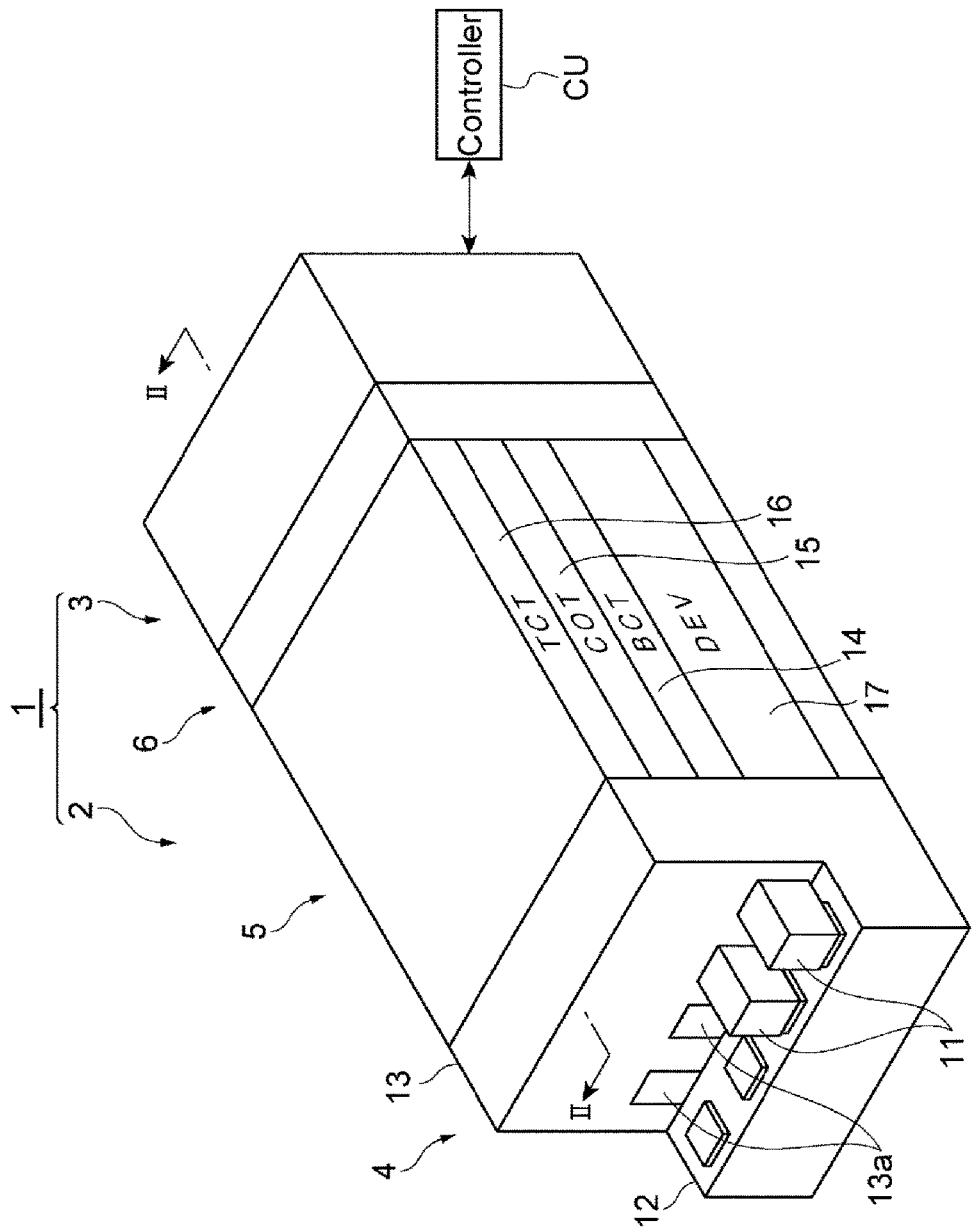
FIG. 1 is a perspective view illustrating a substrate processing system.

In the following detailed description, reference is made to the accompanying drawings, which form a part hereof. The illustrative embodiments described in the detailed description, drawing, and claims are not meant to be limiting. Other embodiments may be utilized, and other changes may be made without departing from the spirit or scope of the subject matter presented here.

In order to form a resist pattern, an exposure processing may be performed on a resist film that exists on the whole surface of a substrate. In such a case, it may be necessary to uniformly expose the resist film in order to ensure an in-plane uniformity of the resist pattern within the surface of the substrate.

However, since the UV lamp, which is provided in the substrate processing apparatus of Japanese Patent Laid-Open Publication No. 2009-111050, is a line light source, the UV lamp is apt to suffer from a variation in light radiation performance in the longitudinal direction thereof, i.e., in light quantity in the longitudinal direction thereof. In addition, it is expected that substrates will be enlarged in the future. When the substrates are enlarged, the UV lamp is also enlarged, and the variation in light quantity may be caused more easily. Moreover, the substrate processing apparatus is also enlarged and complicated as a whole, which possibly leads to an increase in cost.

Therefore, the present disclosure discloses a light irradiation apparatus that is capable of uniformly irradiating light to a whole substrate with a simple configuration.

A light irradiation apparatus according to an aspect of the present disclosure includes: a rotary holding unit configured to rotate a substrate around a rotary axis extending in a direction orthogonal to a surface of the substrate while holding the substrate; a lighting unit positioned to face the rotary holding unit; a light shielding mask positioned between the rotary holding unit and the lighting unit and widened horizontally; and a driving unit configured to linearly move the lighting unit along the direction orthogonal to the rotary axis. The light shielding mask overlaps with the substrate to cover the surface of the substrate held on the rotary holding unit, when viewed in the direction of the rotary axis. The light shielding mask has an opening portion that extends toward an outside from the rotary axis in the direction orthogonal to the rotary axis, and an opening width of the opening portion at a side away from the rotary axis is larger than the opening width near the rotary axis in the direction orthogonal to the rotary axis. The lighting unit irradiates light through the opening portion toward the surface of the substrate held on the rotary holding unit while being moved above the opening portion by the driving unit.

However, in the case where the light shielding mask does not exist, the size of the light irradiation region on the substrate by the lighting unit is constant from the rotary axis to the peripheral edge of the substrate. Therefore, due to the rotation of the substrate, the light is irradiated more redundantly and thus the light irradiation quantity is increased as going closer to the center of the substrate. However, in the light irradiation apparatus according to the aspect of the present disclosure, the opening portion extends from the rotary axis toward the outside and the opening width at the side away from the rotary axis is larger than the opening width near the rotary axis. In addition, the lighting unit irradiates light toward the surface of the substrate held on the rotary holding unit through the opening portion while being moved above the opening portion by the driving unit. Therefore, the light irradiation region reaching the substrate from the lighting unit through the opening portion is small when the lighting unit is positioned near the rotary axis of the opening portion, and increases when the lighting unit moves away from the rotary axis of the opening portion. Accordingly, the light irradiation quantity is likely to be uniformized from the center to the peripheral edge of the substrate. In addition, the light irradiation apparatus according to the aspect of the present disclosure is configured by the rotary holding unit, the lighting unit, the light shielding mask, and the driving unit. Therefore, the number of constituent elements of the light irradiation apparatus according to the aspect of the present disclosure is very small. From the foregoing, it becomes possible to uniformly irradiate light over the whole substrate with the simple configuration.

The opening portion may extend toward the outside from the rotary axis and may be widened as going away from the rotary axis, in the direction orthogonal to the rotary axis. In this case, the light irradiation region reaching the substrate from the lighting unit through the opening portion becomes smaller when the lighting unit is positioned nearer the rotary axis of the opening portion, and gradually increases as the lighting unit moves away from the rotary axis of the opening portion. Accordingly, the light irradiation quantity may be more likely to be uniformized from the center to the peripheral edge of the substrate.

The opening portion may include two sides extending from an intersection point between the mask and the rotary axis, and the two sides may be spaced away from each other as going away from the intersection point. In this case, the two sides of the opening portion form an angle of which the apex corresponds to the intersection point of the two sides. Therefore, the light irradiation quantity may be more likely to be uniformized from the center to the peripheral edge of the substrate.

The substrate may have a circular shape, and the opening portion may have a fan shape.

The rotary holding unit may rotate the substrate at a substantially constant rotating speed. In this case, a control complicated to be suitable for the rotation of the substrate by the rotary holding unit is not required. Therefore, the light irradiation apparatus may be further simplified.

The driving unit may move the substrate at a substantially constant speed. In this case, a control complicated to be suitable for the driving of the lighting unit by the driving unit is not needed. Therefore, the light irradiation apparatus may be further simplified The lighting unit may include a rectangular flat light source, and a pair of opposite side edges of the light source may be orthogonal to an extension direction of the opening portion. In this case, the light irradiation quantity may be further uniformized from the center to the peripheral edge of the substrate by using a light source having a simple structure of a rectangular flat shape.

A light irradiation apparatus according to another aspect of the present disclosure includes: a rotary holding unit configured to rotate a substrate around a rotary axis extending in a direction orthogonal to a surface of the substrate while holding the substrate; a plurality of lighting units positioned to face the rotary holding unit; and a light shielding mask positioned between the rotary holding unit and the plurality of lighting units, and widened along a direction orthogonal to the rotary axis. The light shielding mask overlaps with the substrate to cover the surface of the substrate held on the rotary holding unit, when viewed in the direction of the rotary axis. The light shielding mask has an opening portion that extends toward an outside from the rotary axis in the direction orthogonal to the rotary axis, and an opening width of the opening portion at a side away from the rotary axis being larger than the opening width near the rotary axis in the direction orthogonal to the rotary axis. The plurality of lighting units are arranged above the opening portion so that the opening portion is wholly covered by the plurality of lighting units. Each of the lighting units irradiates light through the opening portion toward the surface of the substrate held on the rotary holding unit.

However, in the case where the light shielding mask does not exist, the size of the light irradiation region on the substrate by the lighting unit is constant from the rotary axis to the peripheral edge of the substrate. Therefore, due to the rotation of the substrate, the light is irradiated more redundantly and thus the light irradiation quantity is increased as going closer to the center of the substrate. However, in the light irradiation apparatus according to another aspect of the present disclosure, the opening portion extends from the rotary axis toward the outside and the opening width at the side away from the rotary axis is larger than the opening width near the rotary axis. In addition, the plurality of lighting units are arranged above the opening portion to cover the entire opening portion by the plurality of lighting units, and each of the lighting units irradiates light toward the surface of the substrate held on the rotary holding unit through the opening portion. Therefore, the light irradiation region reaching the substrate from the plurality of lighting units through the opening portion is small at a position near the rotary axis, and large at a position spaced away from the rotary axis. Accordingly, the light irradiation quantity is likely to be uniformized from the center to the peripheral edge of the substrate. In addition, the light irradiation apparatus according to the other aspect of the present disclosure is provided with a plurality of relatively small lighting units. Therefore, a variation in light quantity more hardly occurs as compared to a large lighting unit. Even if a variation in light quantity occurred between the plurality of lighting units due to individual differences, the whole light irradiation quantity can be uniformized by individually adjusting the output of each of the lighting units. In addition, the light irradiation apparatus according to the other aspect of the present disclosure is configured by the rotary holding unit, the plurality of lighting units, and the light shielding mask. Therefore, the number of constituent elements of the light irradiation apparatus according to the other aspect of the present disclosure is very small, and it is not necessary to move the lighting units. From the foregoing, it becomes possible to uniformly irradiate light over the whole substrate with the simple configuration.

According to the light irradiation apparatus of the present disclosure, it becomes possible to uniformly irradiate light over a whole substrate with a simple configuration.

Exemplary embodiments of the present disclosure will be described with reference to the accompanying drawings. However, the following exemplary embodiments are examples provided for describing the present disclosure and are not intended to limit the present disclosure to the following description. In the following description, the same elements or the elements having the same functions will be denoted by the same symbols, and overlapping descriptions will be omitted.

[Configuration of Substrate Processing System]

A substrate processing system 1 includes a coating and developing apparatus 2, an exposure apparatus 3, and a controller CU (control means). The exposure apparatus 3 performs an exposure processing of a resist film (photosensitive film) (not illustrated) formed on a surface Wa of a wafer W (substrate) (see, e.g., FIG. 4). Specifically, the exposure apparatus 3 selectively irradiates extreme ultraviolet (EUV) light to an exposure target portion of the resist film by a method such as, for example, immersion exposure. Accordingly, exposure by the EUV light is performed in a predetermined pattern on the resist film of the surface Wa of the wafer W. The EUV light has a wavelength of, for example, 13.5 nm.

The coating and developing apparatus 2 performs a processing of forming the resist film on the surface of the wafer W (substrate) prior to the exposure processing by the exposure apparatus 3, and performs a developing processing of the resist film after the exposure processing. In the present exemplary embodiment, the wafer W has a circular shape. A wafer, which has a shape other than the circular shape such as, for example, a partially notched circular shape or a polygonal shape, may also be used. The wafer W may be, for example, a semiconductor substrate, a glass substrate, a mask substrate, a flat panel display (FPD) substrate, or other various types of substrates. The diameter of the wafer W may be, for example, about 200 mm to about 450 mm.

Figure 2:
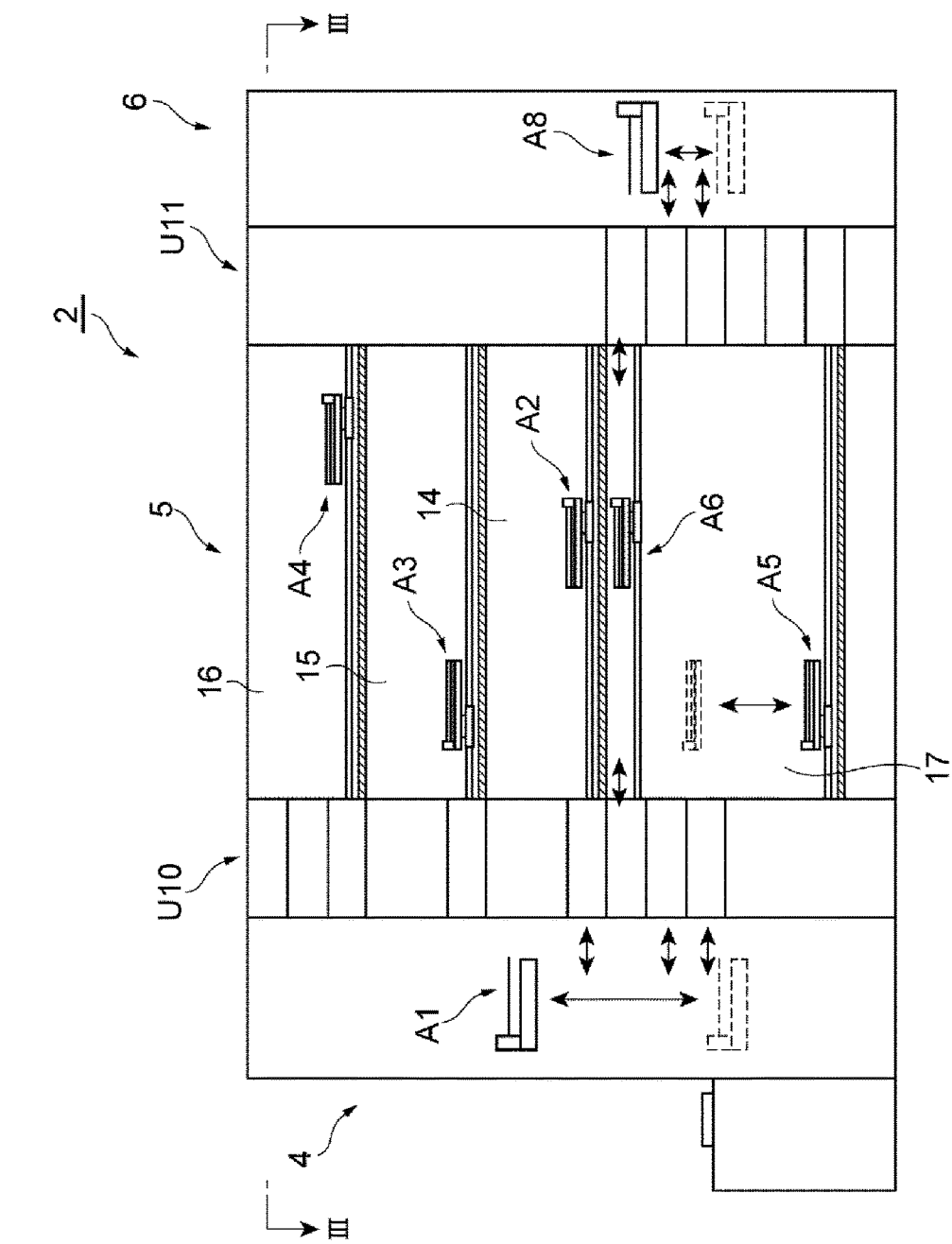
FIG. 2 is a sectional view taken along line II-II of FIG. 1.
Figure 3:
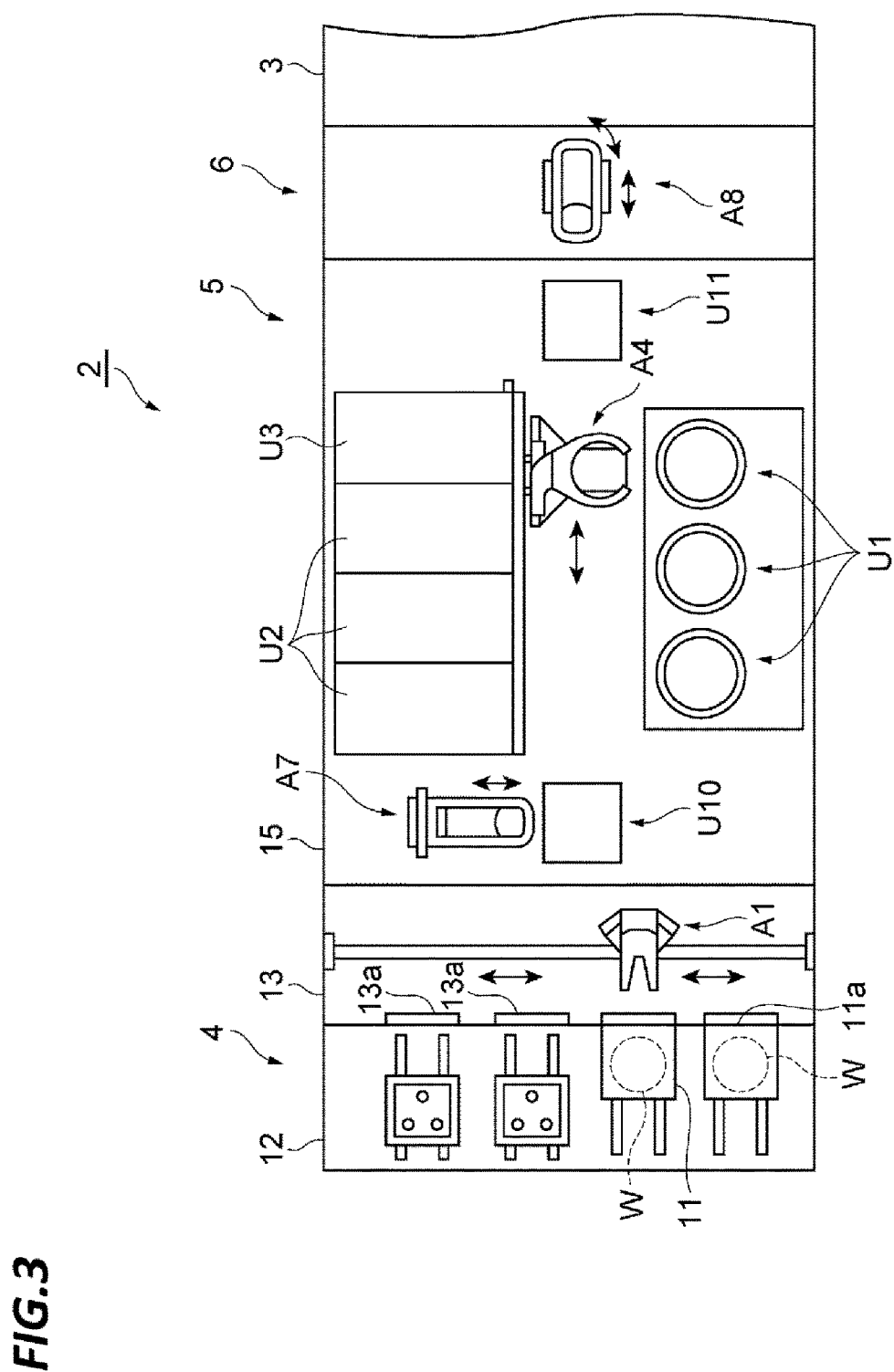
FIG. 3 is a sectional view taken along line of FIG. 2.

As illustrated in FIGS. 1 to 3, the coating and developing apparatus 2 includes a carrier block 4, a processing block 5, and an interface block 6. The carrier block 4, the processing block 5, and the interface block 6 are aligned in a horizontal direction.

The carrier block 4 includes a carrier station 12 and a carry-in/out section 13. The carrier station 12 supports a plurality of carriers 11. Each carrier 11 accommodates, for example, a plurality of wafers W in a sealed state, and has an opening/closing door for loading/unloading the wafers W (not illustrated) on a side surface 11a side (see, e.g., FIG. 3). The carrier 11 is removably installed on the carrier station 12 such that the side surface 11a faces the carry-in/out section 13 side.

The carry-in/out section 13 is positioned between the carrier station 12 and the processing block 5. The carry-in/out section 13 includes a plurality of opening/closing doors 13a which correspond to the plurality of carriers 11 on the carrier station 12, respectively. When the opening/closing doors of the side surfaces 11a and the corresponding opening/closing doors 13a are simultaneously opened, the inside of the carriers 11 and the inside of the carry-in/out section 13 are communicated with each other. The carry-in/out section 13 includes a transfer arm A1 therein. The transfer arm A1 takes out a wafer W from a carrier 11 and transfers the wafer W to the processing block 5. The transfer arm A1 receives a wafer W from the processing block 5 and returns the wafer W to the inside of the carrier 11.

The processing block 5 includes a BCT module 14, a COT module 15, a TCT module 16, and a DEV module 17. The BCT module 14 is an underlayer film forming module. The COT module 15 is a resist film forming module. The TCT module 16 is an upper-layer film forming module. The DEV module 17 is a developing module. The modules are aligned in the order of the DEV module 17, the BCT module 14, the COT module 15, and the TCT module 16, from the bottom surface side.

The BCT module 14 is configured to form an underlayer film on the surface of a wafer W. The BCT module 14 includes therein a plurality of coating units (not illustrated), a plurality of heat treatment units (not illustrated), and a conveyance arm A2 configured to convey wafers W to these units. Each coating unit is configured to coat an underlayer film-forming coating liquid to the surface of a wafer W. Each heat treatment unit is configured to perform a heat treatment by heating a wafer W by, for example, a hot plate, and cooling the heated wafer W by, for example, a cold plate. A specific example of heat treatment performed in the BCT module 14 may include a heating treatment for curing a coating liquid to form an underlayer film.

The COT module 15 is configured to form a thermosetting and photosensitive resist film on the underlayer film. The COT module 15 includes therein a plurality of coating units (not illustrated), a plurality of heat treatment units (not illustrated), and a conveyance arm A3 configured to convey wafers W to these units (see, e.g., FIG. 2). Each coating unit is configured to coat a resist film forming processing liquid (a resist material) on an underlayer film. Each heat treatment unit is configured to perform a heat treatment by heating a wafer W by, for example, a hot plate, and cooling the heated wafer W by, for example, a cold plate. A specific example of heat treatment performed in the COT module 15 may include a heating processing for curing a coating liquid to form a resist film (pre applied bake (PAB)).

The TCT module 16 is configured to form an upper-layer film on a resist film. The TCT module 16 includes therein a plurality of coating units U1, a plurality of heat treatment units U2, a light irradiation unit U3 (a light irradiation apparatus), and a conveyance arm A4 configured to convey wafers W to these units. Each coating unit U1 is configured to coat an upper-layer film forming coating liquid on the surface of a wafer W. Each heat treatment unit U2 is configured to perform a heat treatment by heating a wafer W by, for example, a hot plate, and cooling the heated wafer W by, for example, a cold plate. A specific example of heat treatment performed in the TCT module 16 may include a heating treatment for curing the coating liquid to form an upper-layer film. The details of the light irradiation unit U3 will be described below.

The DEV module 17 is configured to perform a developing processing of an exposed resist film. The DEV module 17 includes therein a plurality of developing units (not illustrated), a plurality of heat treatment units (not illustrated), a conveyance arm A5 configured to convey wafers W to these units, and a direct conveyance arm A6 configured to directly convey a wafer W without passing through these units. Each developing unit is configured to partially remove a resist film to form a resist pattern. Each heat treatment unit performs a heat treatment by heating a wafer W by, for example, a hot plate, and cooling the heated wafer W by, for example, a cold plate. A specific example of the heat treatment performed in the DEV module 17 may include, for example, a heating treatment performed prior to a developing processing (post exposure bake (PEB)) and a heating treatment performed after the developing processing (post bake (PB)).

At the carrier block 4 side within the processing block 5, a shelf unit U10 is provided (see, e.g., FIGS. 2 and 3). The shelf unit U10 is installed to reach the TCT module 16 from the bottom surface, and partitioned into a plurality of cells that are arranged in the vertical direction. In the vicinity of the shelf unit U10, a lifting arm A7 is provided. The lifting arm A7 raises/lowers a wafer W between the cells of the shelf unit U10.

At the interface block 6 side within the processing block 5, a shelf unit U11 is provided (see, e.g., FIGS. 2 and 3). The shelf unit U11 is installed to reach the upper portion of the DEV module 17 from the bottom surface, and partitioned into a plurality of cells that are arranged in the vertical direction.

The interface block 6 includes therein a transfer arm A8, and is connected to the exposure apparatus 3. The transfer arm A8 is configured to take out a wafer W from the shelf unit U11, transfer the wafer W to the exposure apparatus 3, receive a wafer W from the exposure apparatus 3, and return the wafer W to the shelf unit U11.

The controller CU is configured by one or more control computers, and partially or wholly controls the substrate processing system 1. The controller CU includes a display unit (not illustrated) configured to display a control condition setting screen, an input unit (not illustrated) configured to input a control condition, and a reading unit (not illustrated) configured to read a program form a computer-readable storage medium. The storage medium stores a program for causing the substrate processing system 1 to execute various operations. The program is read by the reading unit of the controller CU. The storage medium may be, for example, a semiconductor memory, an optical recording disc, a magnetic recording disc, or a magneto-optical recording disc. The controller CU controls the substrate processing system 1 and causes various operations to be executed in the substrate processing system 1 according to the control condition input through the input unit and the program read by the reading unit.

[Configuration of Light Irradiation Unit]

Figure 4:
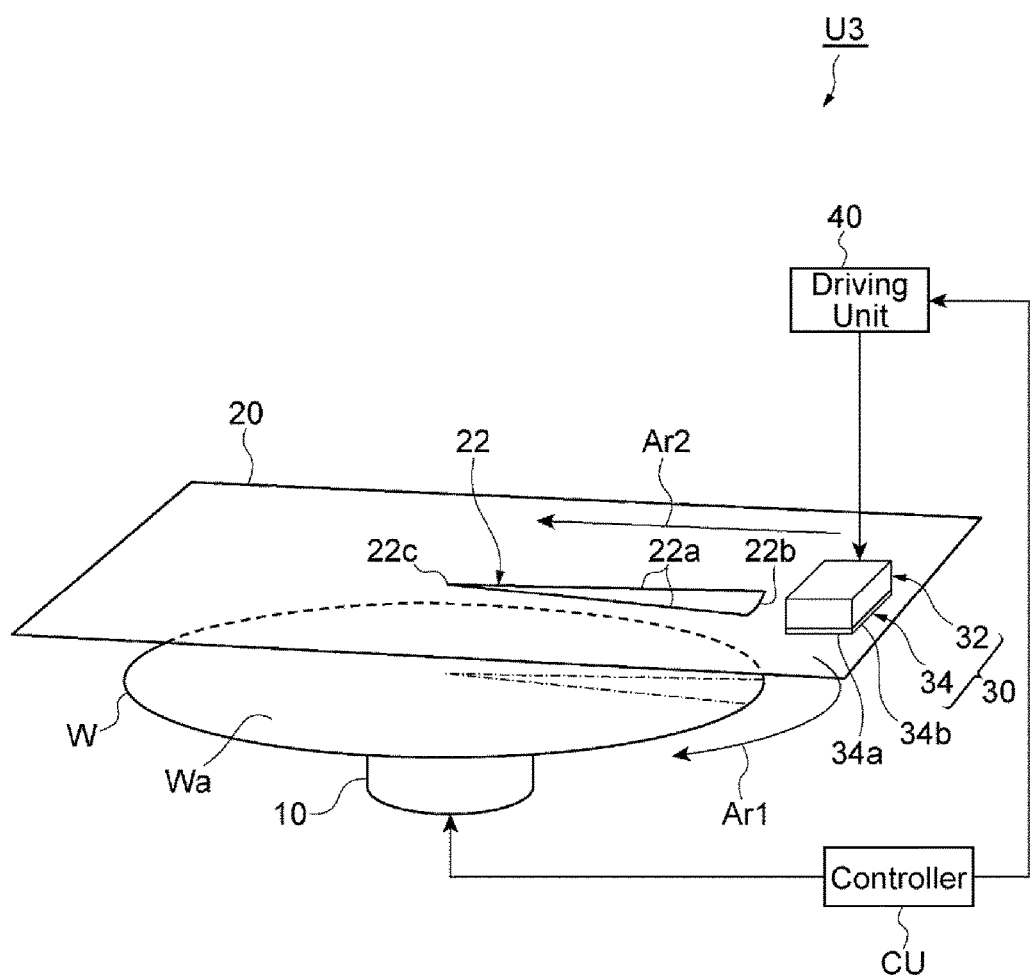
FIG. 4 is a view schematically illustrating a light irradiation apparatus.

Subsequently, the light irradiation unit U3 will be described in more detail. The light irradiation unit U3 performs exposure by UV light on the whole resist film on a wafer W which has been subjected to exposure by EUV light in the exposure apparatus 3. As illustrated in FIG. 4, the light irradiation unit U3 includes a rotary holding unit 10, a light shielding mask 20, a lighting unit 30, and a driving unit 40.

The rotary holding unit 10 includes a holding unit (not illustrated) and a power source (not illustrated). The holding unit holds a wafer W substantially horizontally by, for example, suction. The power source is, for example, an electric motor and rotationally drives the holding unit. That is, in the state where the posture of the wafer W is substantially horizontal, the rotary holding unit 10 rotates the wafer W around an axis (rotary axis) that is perpendicular to the surface Wa of the wafer W based on an instruction from the controller CU. In the present exemplary embodiment, the rotary axis is also a central axis because it passes through the center of the wafer W that has a circular shape. As illustrated in FIG. 4, in the present exemplary embodiment, the rotary holding unit 10 rotates the wafer W in a clockwise direction when viewed from the upper side (see arrow Art).

The light shielding mask 20 is positioned above the rotary holding unit 10. The linear distance between the light shielding mask 20 and the surface Wa of the wafer W held on the rotary holding unit 10 in the direction of the rotary axis may be, for example, about 0.5 mm to about 2.0 mm, or may be about 1 mm. In the present exemplary embodiment, the light shielding mask 20 is a rectangular flat plate, and is spread substantially horizontally. That is, the light shielding mask 20 is substantially parallel to the surface Wa of the wafer W held on the rotary holding unit 10.

When viewed in the direction of the rotary axis, the light shielding mask 20 overlaps with the wafer W to cover the whole surface Wa of the wafer W held on the rotary holding unit 10. The area of the light shielding mask 20 is larger than the area of the wafer W. Therefore, the light irradiated from the lighting unit 30 hardly reaches the wafer W by turning around from the outer periphery of the light shielding mask 20.

In the light shielding mask 20, an opening portion 22 is formed to penetrate the light shielding mask 20 in the thickness direction thereof (the direction of the rotary axis). The opening portion 22 extends along the radial direction of the wafer W when viewed in the direction of the rotary axis. In the present exemplary embodiment, the opening portion 22 has a fan shape. That is, the opening portion 22 is composed of two sides 22a and one circular arc 22b. The two sides 22a extend in a direction orthogonal to the rotary axis such that the two sides 22a are spaced away from each other (such that the distance therebetween is increased) as going away from the rotary axis. That is, the opening portion 22 is widened as going away from the rotary axis. The intersection point of the two sides 22a substantially coincides with an intersection point of the central axis and the light shielding mask 20. Therefore, the two sides 22a extend outwardly from the intersection point between the light shielding mask 20 and the central axis. The angle (central angle) formed by the two sides 22a may be, for example, larger than 0° and 45° or less, may be, for example, larger than 0° and 30° or less, and may be larger than 0° and 15° or less. The length of the two sides 22a is substantially the same as the radius of the wafer W. The curvature radius of the circular arc 22b is substantially the same as the radius of the wafer W. From the foregoing, when viewed in the direction of the rotary axis, the intersection point of the two sides 22a substantially coincides with the central axis, and the circular arc 22b substantially coincides with the peripheral edge of the wafer W.

The lighting unit 30 is positioned above the light shielding mask 20. That is, the light shielding mask 20 is positioned between the lighting unit 30 and the rotary holding unit 10. The linear distance between the lighting unit 30 and the light shielding mask 20 in the direction of the rotary axis may be, for example, about 1 mm to about 5 mm.

The lighting unit 30 has a rectangular parallelepiped shape. The height of the lighting unit 30 (the length in the direction of the rotary axis) may be, for example, about 10 mm to about 50 mm. The depth of the lighting unit 30 (the length in the extension direction of the opening portion 22) may be, for example, about 10 mm to about 30 mm. The width of the lighting unit 30 (the length in the direction orthogonal to the direction of the rotary axis and the extension direction of the opening portion 22) may be, for example, about 10 mm to about 60 mm.

The lighting unit 30 includes a body 32, and a rectangular flat light source 34 arranged on the bottom surface of the body 32. The light source 34 includes a pair of first side edges 34a and a pair of second side edges 34b when viewed from the direction of the rotary axis. The first side edges 34a have a linear shape, and extend along the extension direction of the opening portion 22 (the diametric direction of the wafer W). The second side edges 34b have a linear shape, and extend in the direction orthogonal to both the direction of the rotary axis and the extension direction of the opening portion 22. The area of the light source 34 may be, for example, about 100 mm$^2$ to about 1800 mm$^2$. The area of the light source 34 may be about 0.1% to about 0.3% of the area of the surface Wa of the wafer W. In view of the uniformity in irradiation quantity of light, the size of the width of the light source 34 may be within 10 times the size of the depth of the light source 34, and may be 6 times the depth of the light source 34.

The light source 34 emits UV light downwardly. The UV light emitted from the light source 34 does not pass through the light shielding mask 20, but reaches the surface Wa of the wafer W positioned below the light source 34 through the opening portion 22. Therefore, exposure by the UV light is performed with respect to the resist film on the surface Wa of the wafer W. The wavelength of the UV light may be within the range of 220 nm to 280 nm, and may be any one of 222 nm, 248 nm, and 254 nm Among them, the wavelength of the UV light may be in particular 248 nm. In the space between the light source 34 (the lighting unit 30) and the surface Wa of the wafer W, air may be interposed or an inert gas (e.g., nitrogen gas) may be interposed. The space between the light source 34 (the lighting unit 30) and the surface Wa of the wafer W may be in a vacuum state. By irradiating the UV light through the inert gas or the vacuum, it is possible to suppress the deactivation of an acid that is caused by an amine component contained in the air in a minute quantity.

Based on an instruction from the controller CU, the driving unit 40 linearly moves the lighting unit 30 along the horizontal direction (see arrow Ar2). More specifically, the driving unit 40 moves the lighting unit 30 linearly along the extension direction of the opening portion 22 such that the lighting unit 30 passes over the opening portion 22. Therefore, while the lighting unit 30 moves over the opening portion 22 when viewed along the direction of the rotary axis, the light emitted from the lighting unit 30 is irradiated to the surface Wa of the wafer W through the opening portion 22. Based on the instruction from the controller CU, the driving unit 40 also performs an ON/OFF control of the light source 34 or a control of the irradiation quantity of light from the light source 34 by giving an instruction to the lighting unit 30. In addition, the driving unit 40 may move the lighting unit 30 toward the central axis side from the peripheral edge side of the wafer W, may move the lighting unit 30 toward the peripheral edge side of the wafer W from the central axis side, or may move the lighting unit 30 to reciprocate between the peripheral edge side of the wafer W and the central axis side.

[Control by Controller]

First, the controller CU controls the coating and developing apparatus 2 to perform a processing of forming an underlayer film in the BCT module 14. Subsequently, the controller CU controls the coating and developing apparatus 2 to perform a processing of forming a resist film on the underlayer film in the COT module 15. Subsequently, the controller CU controls the coating and developing apparatus 2 to perform a processing of forming a protective film on the resist film in the TCT module 16. Subsequently, the controller CU controls the exposure apparatus 3 to expose the resist film with EUV light in a predetermined pattern.

Figure 5:
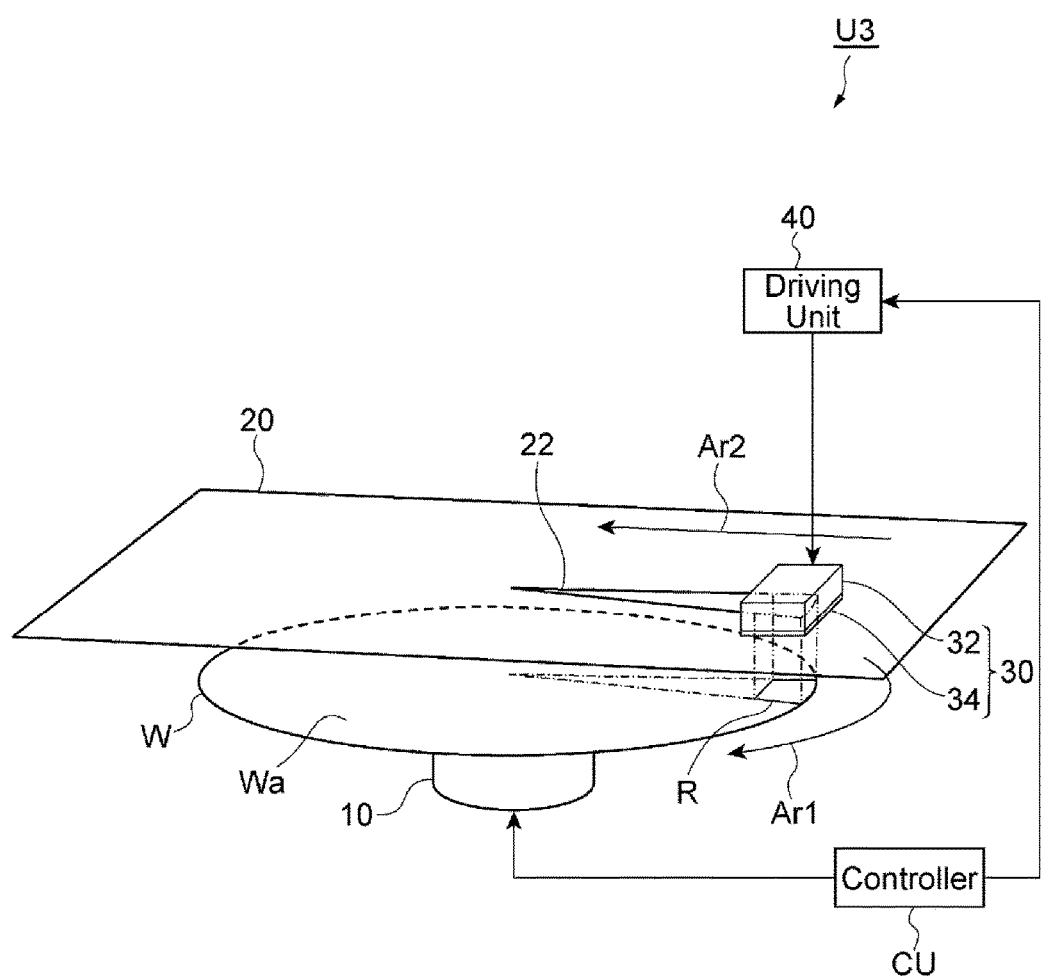
FIG. 5 is a view for describing an operation of the light irradiation apparatus.
Figure 6:
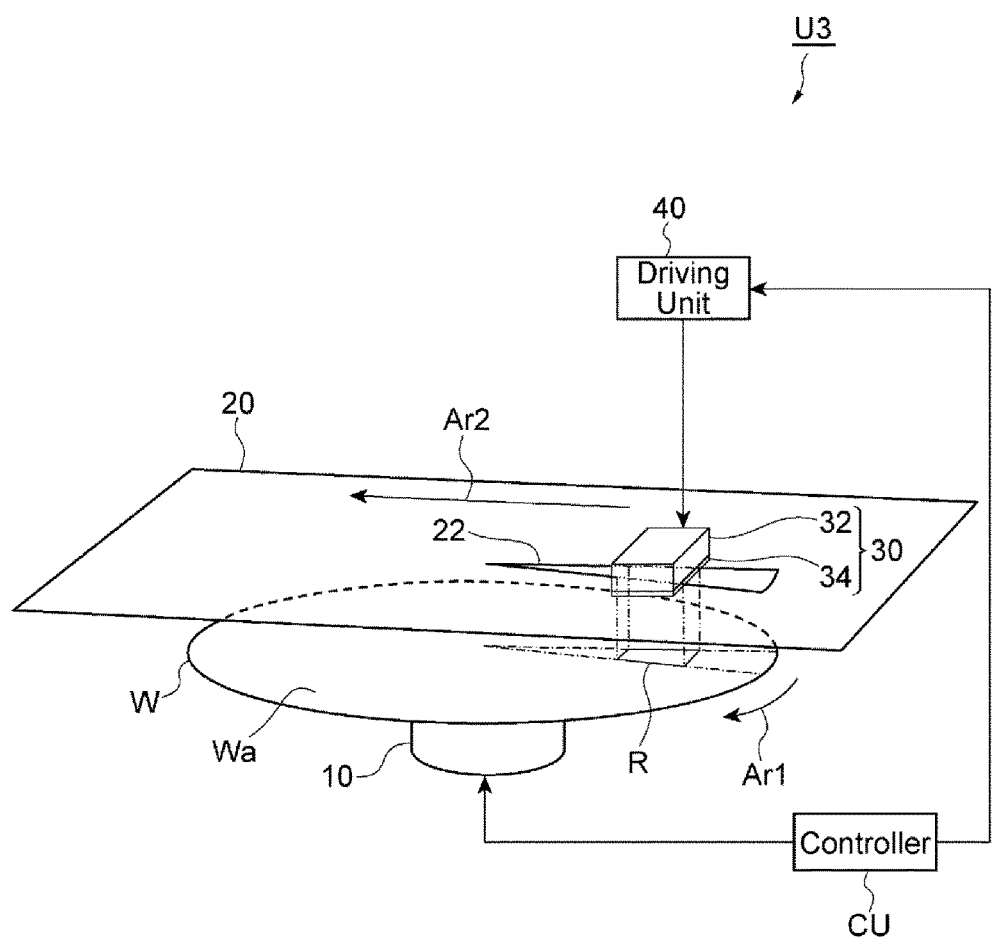
FIG. 6 is a view for describing an operation of the light irradiation apparatus.

Subsequently, the controller CU controls the coating and developing apparatus 2 to expose the whole resist film with UV light in the light irradiation unit U3. Specifically, the controller CU gives an instruction to the rotary holding unit 10, which is holding the wafer W having the resist film formed on the surface Wa, to cause the rotary holding unit 10 to rotate at a predetermined rotating speed (angular velocity). Subsequently, the controller CU gives an instruction to the driving unit 40 to linearly move the lighting unit 30 along the extension direction of the opening portion 22. In that event, in the case where the lighting unit 30 moves from the peripheral edge side of the wafer W toward the rotary axis side, the irradiation region R on the surface Wa of the wafer W, which is irradiated by UV light emitted from the lighting unit 30 through the opening portion 22, is reduced as the lighting unit 30 is directed to the rotary axis side from the peripheral edge side of the wafer W (see, e.g., FIGS. 5 and 6).

Subsequently, the controller CU controls the coating and developing apparatus 2 to perform the heating processing prior to the developing processing (PEB) with respect to the resist film in the DEV module 17. Subsequently, the controller CU controls the coating and developing apparatus 2 to perform the developing processing of the exposed resist film. Through the process described above, a predetermined resist pattern is formed on the surface Wa of the wafer W.

[Action]

The following methods are considered to expose the whole resist layer on the surface Wa of the wafer W.

(1) A method of providing a plane light source having an area equal to or larger than that of the surface Wa of the wafer W, and irradiating light to the entire surface Wa of the wafer W as a whole.

(2) A method of providing a line light source having a size equal to or larger than the diameter of the wafer W, and sequentially irradiating light to the surface Wa of the wafer W while linearly moving the line light source along one direction parallel to the surface Wa of the wafer W.

(3) A method of providing a rectangular plane light source smaller than the line light source and similar to that of the present exemplary embodiment, and sequentially irradiating light to the surface Wa of the wafer W while making the plane light source meander on the surface Wa of the wafer W.

(4) A method of providing a rectangular plane light source smaller than the line light source and similar to that of the present exemplary embodiment, and sequentially irradiating light to the surface Wa of the wafer W while linearly moving the plane light source along the diametric direction of the wafer W without interposing a light shielding mask similar to the light shielding mask 20 of the present exemplary embodiment.

However, since the methods (1) and (2) require a light source having a large area and high luminance, a variation in light quantity is likely to occur in the plane of the light source. In addition, an apparatus including the light source may be enlarged, which possibly leads to a high cost. In the method (3), the concern for the variation in light quantity is addressed. However, in order to uniformly irradiate light to the entire surface Wa of the wafer W, it is necessary to move the light source very highly accurately. Therefore, since it becomes necessary to mount a highly accurate driving mechanism, enlargement of the apparatus is also caused, which possibly leads to a high cost. In the method (4), the size of the light illumination region by the light source with respect to the wafer W is constant even if the light source is moved. Therefore, light is redundantly irradiated as going closer to the center of the wafer W so that the irradiation quantity of light increases. Even if the moving speed of the light source is increased or the rotating speed of the wafer W is increased as the light source goes closer to the central axis, the light is certainly redundantly irradiated at the center of the wafer W. Accordingly, it is difficult to uniformize the irradiation quantity of light.

However, in the present exemplary embodiment as described above, the opening portion 22 extends toward the outside from the rotary axis and is widened as going away from the rotary axis. In addition, the lighting unit 30 irradiates light toward the surface Wa of the wafer W held on the rotary holding unit 10 through the opening portion 22 while being moved over the opening portion 22 by the driving unit 40. Therefore, the irradiation region R of the light reaching the wafer W from the lighting unit 30 through the opening portion 22 is reduced as the lighting unit 30 is located closer to the rotary axis of the opening portion 22, and is increased as the lighting unit 30 is located farther away from the rotary axis of the opening portion 22. Accordingly, the irradiation quantity of light is likely to be uniformized from the center to the peripheral edge of the wafer W. In addition, according to the present exemplary embodiment, the light irradiation unit U3 includes the rotary holding unit 10, the light shielding mask 20, the lighting unit 30, and the driving unit 40. Therefore, the number of components of the light irradiation unit U3 is very small. With the forgoing features, it becomes possible to uniformly irradiate light over the entire wafer W through a simple configuration.

In the present exemplary embodiment, the opening portion 22 has a fan shape. That is, the two sides 22a of the opening portion 22 extend from the intersection point thereof along a direction orthogonal to the rotary axis such that the two sides 22a are spaced away from each other as going away from the rotary axis. Therefore, the two sides of the opening portion 22 form an angle of which the apex corresponds to the intersection point 22c of the two sides. Accordingly, the irradiation quantity of light may be further uniformized from the center to the peripheral edge of the wafer W.

In the present exemplary embodiment, the light source 34 of the lighting unit 30 has a rectangular flat shape. In addition, a pair of second side edges 34b of the light source 34 extends along a direction orthogonal to the extension direction of the opening portion 22. Therefore, the irradiation quantity of light may be further uniformized from the center to the peripheral edge of the wafer W by using the light source 34 with the simple structure of the rectangular flat shape.

Other Exemplary Embodiments

Figure 7A:
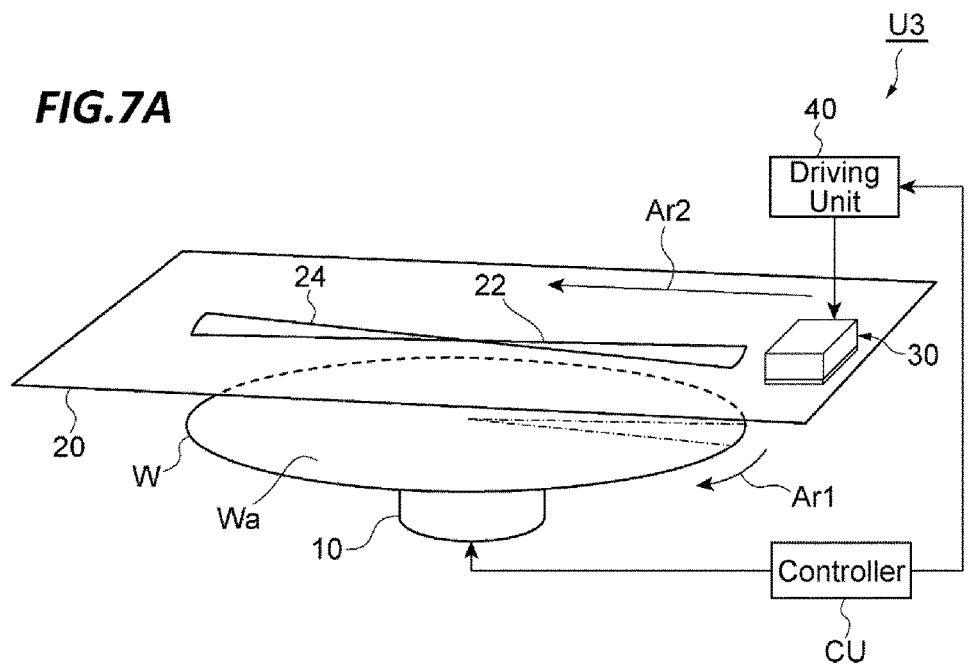
FIGS. 7A and 7B are views schematically illustrating another exemplary light irradiation apparatus.
Figure 7B:
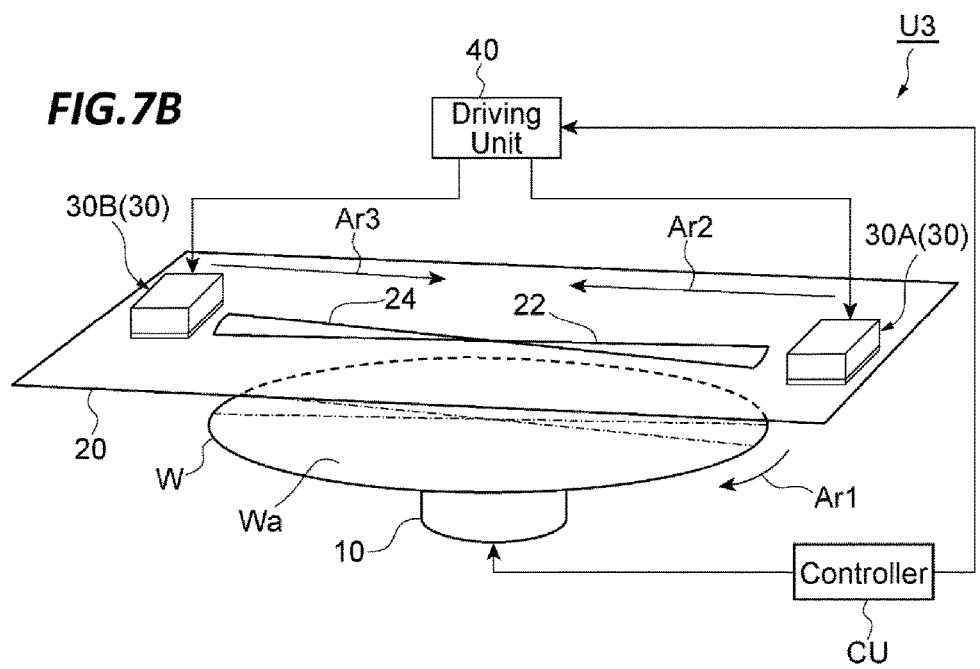

While the exemplary embodiments of the present disclosure have been described in detail above, various modifications may be added to the above-described exemplary embodiments within the scope of the gist of the present disclosure. For example, two or more opening portions may be formed in the light shielding mask 20. In the example illustrated in FIGS. 7A and 7B, two opening portions 22, 24 are formed in the light shielding mask 20. In that event, as illustrated in FIG. 7A, the driving unit 40 may move a single lighting unit 30 such that the single lighting unit 30 is moved above the two opening portions 22, 24. As illustrated in FIG. 7B, the light irradiation unit U3 may include two lighting units 30 (30A, 30B), in which the driving unit 40 may individually move each of the lighting units 30A, 30B such that the lighting unit 30A corresponding to the opening portion 22 may move above the opening portion 22 (see arrow Ar2) and the lighting unit 30B corresponding to the opening portion 24 may move above the opening portion 24 (see arrow Ar3). With these lighting units, it is possible to achieve uniformity in irradiation quantity of light with respect to the surface Wa of the wafer W and to improve processing efficiency. The sizes of the plurality of opening portions may not be equal to each other. In addition, among the plurality opening portions, an interval between two adjacent opening portions in the circumferential direction may not be equal to another interval between other two adjacent opening portions in the circumferential direction.

Although the opening portion 22 of the present exemplary embodiment has a fan shape, the opening portion 22 may have any other shape (e.g., a trapezoidal shape) as long as it is widened as going away from the rotary axis.

Figure 8:
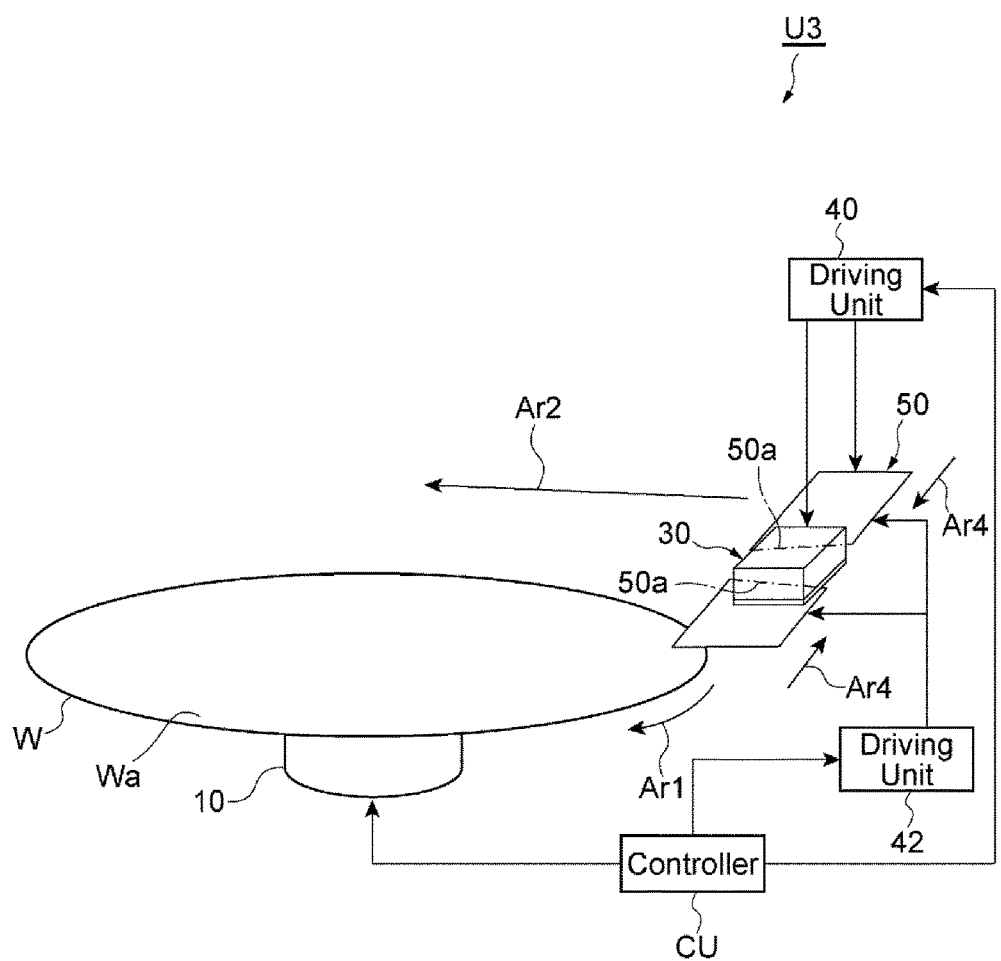
FIG. 8 is a view schematically illustrating another exemplary light irradiation apparatus.

In the present exemplary embodiment, the light shielding mask 20 is stopped in position without being driven. However, a pair of light shielding masks 50, which may come close to each other and be spaced away from each other as illustrated in FIG. 8, may be used in place of such a light shielding mask 20. More specifically, the light irradiation unit U3 may further include a pair of light shielding masks 50 and a driving unit 42 configured to drive the light shielding masks 50. The driving unit 40 linearly moves the pair of light shielding masks 50 together with the lighting unit 30 along the diametric direction of the wafer W (see arrow Ar2). The driving unit 42 moves the pair of light shielding masks 50 such that the light shielding masks 50 come to close to each other as the lighting unit 30 and the pair of light shielding masks 50 are directed to the central axis side (see arrow Ar4). The driving unit 42 moves the pair of light shielding masks 50 such that the light shielding masks 50 are spaced away from each other as the lighting unit 30 and the pair of light shielding masks 50 are directed to the peripheral edge side of the wafer W (see arrow Ar4). The pair of light shielding masks 50 are arranged below the lighting unit 30. The opposite sides 50a of the pair of light shielding masks 50 extend along a direction orthogonal to the rotary axis such that the opposite sides 50a are spaced away from each other as going away from the rotary axis.

The opening portion 22 may have a shape of which the width expansion rate may either increase or decrease toward the outside, unlike the fan shape of which the width expansion rate is constant. The opening portion 22 has a fan shape. However, as long as the opening width at the side away from the rotary axis is formed to be larger than the opening width in the vicinity of the rotary axis, the opening portion may have any other shape such as, for example, a trapezoidal shape. An example of the other shape is illustrated in FIG. 9.

Figure 9:
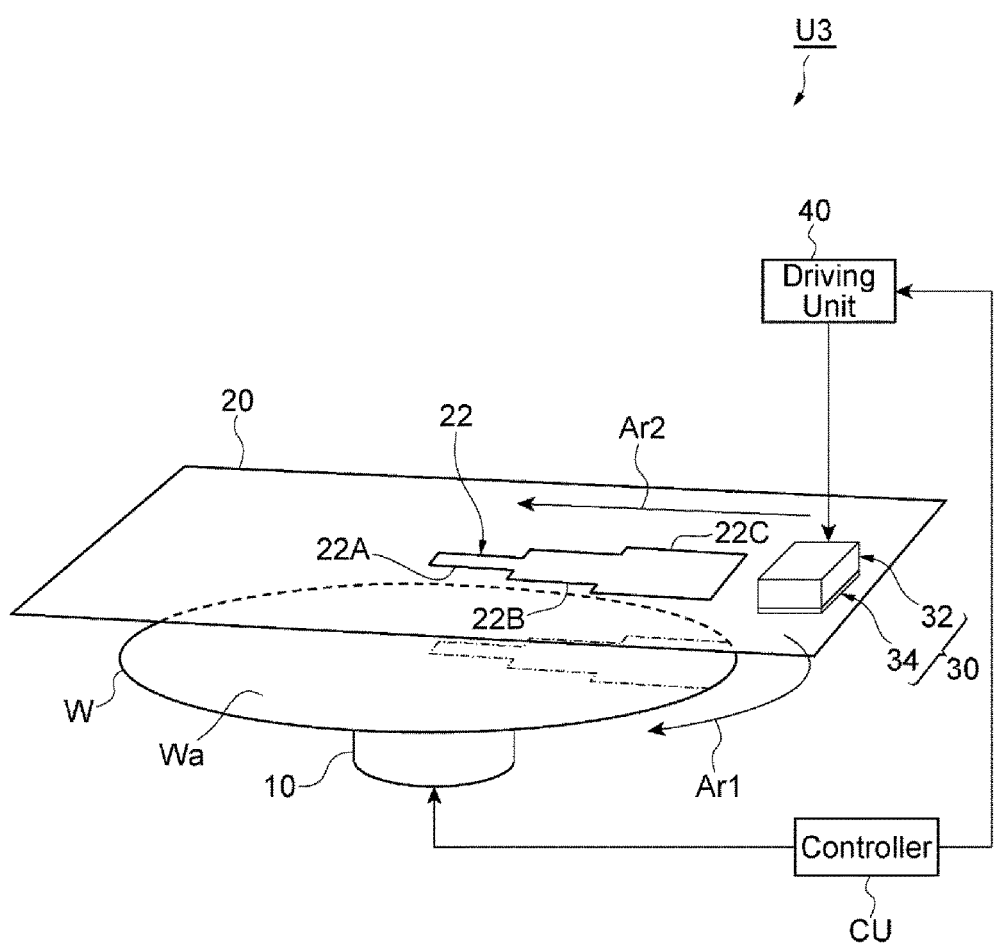
FIG. 9 is a view schematically illustrating another exemplary light irradiation apparatus.

The opening portion 22 illustrated in FIG. 9 includes a first portion 22A, a second portion 22B, and a third portion 22C. The first portion 22A is positioned nearest to the rotary axis. The third portion 22C is positioned at the side farthest away from the rotary axis. The second portion 22B is positioned between the first portion 22A and the third portion 22C. The opening width of the first portion 22A (the width in the direction orthogonal to both of the direction of the rotary axis and the extension direction of the opening portion 22) is smaller than the opening widths of the second portion 22B and the third portion 22C. The opening width of the second portion 22B is smaller than the opening width of the third portion 22C. Accordingly, the opening widths of the first to third portions 22A to 22C are sequentially increases toward the direction away from the rotary axis.

Figure 10:
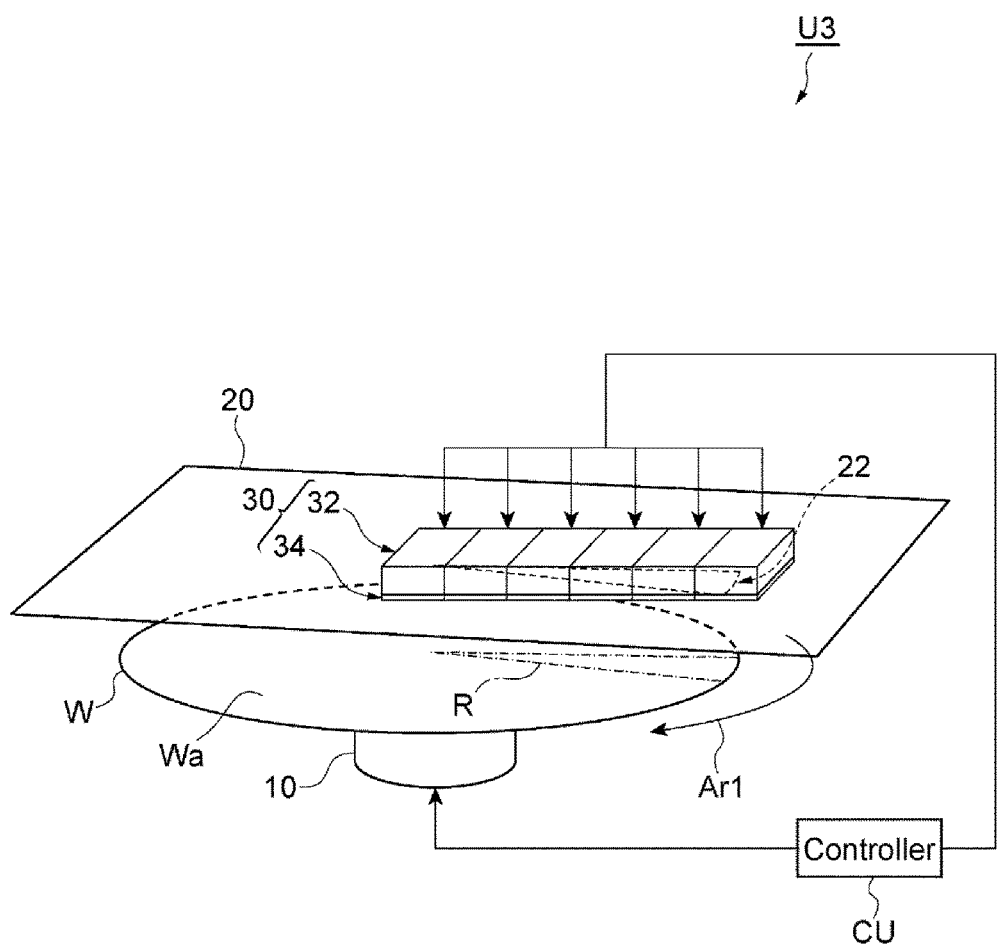
FIG. 10 is a view schematically illustrating another exemplary light irradiation apparatus.

In the present exemplary embodiment, the lighting unit 30 is moved by the driving unit 40. However, the light irradiation unit U3 may not include the driving unit 40. In this case, the light irradiation unit U3 includes a plurality of lighting units 30 as illustrated in FIG. 10. The plurality of lighting units 30 are directly controlled by the controller CU. The plurality of lighting units 30 are arranged in a row in the extension direction of the opening portion 22 (the direction orthogonal to the rotary axis) to be adjacent to each other, thereby forming one lighting unit group. The lighting unit group covers the whole opening portion 22. Therefore, the light irradiated from each of the lighting units 30 that form the lighting unit group is irradiated to the surface Wa of the wafer W through the opening portion 22. That is, on the surface Wa of the wafer W, a region, which has substantially the same shape as the opening portion 22, becomes an irradiation region R. In this case, since the driving unit 40 is not needed, the configuration of the light irradiation unit U3 may be more simplified. In addition, since the lighting unit group is configured by a plurality of relatively small lighting units 30, a variation in light quantity more hardly occurs as compared to a large lighting unit. Even if a variation in light quantity occurred between the plurality of lighting units 30 due to individual differences, the whole irradiation quantity of light may be uniformized by individually adjusting the outputs of the lighting units 30 by the controller CU.

In order to suppress the diffraction of light from the light shielding mask 20, an auxiliary wall extending from the sides 22a and the circular arc 22b of the opening portion 22 toward the wafer W side (the rotary holding unit 10 side) may be formed. Alternatively, the thickness of the light shielding mask 20 itself may be increased.

The rotary holding unit 10 may rotate the wafer W at a substantially constant rotating speed, or may change the rotating speed of the wafer W depending on the movement of the lighting unit 30. In this case, a control complicated to be suitable for the rotation of the wafer W by the rotary holding unit 10 is not needed. Therefore, the light irradiation unit U3 may be further simplified.

The driving unit 40 may move the lighting unit 30 at a substantially constant speed, or may change the moving speed of the lighting unit 30 depending on the movement of the lighting unit 30. In this case, a control complicated to be suitable for the driving of the lighting unit 30 by the driving unit 40 is not needed. Therefore, the light irradiation unit U3 may be further simplified.

The driving unit 40 may move the lighting unit 30 such that advancing and stopping of the lighting unit 30 are alternately repeated intermittently.

While the shape of the light shielding mask 20 is not particularly limited, the light shielding mask 20 has a size capable of suppressing the light irradiated from the lighting unit 30 from being turned from the outer edges of the light shielding mask 20.

The light irradiation unit U3 may have a controller different from the controller CU, and each element of the light irradiation unit U3 may be controlled by the controller.

In the present exemplary embodiment, the lighting unit 30 (light source 34) has a rectangular shape. However, the lighting unit 30 (light source 34) may have other shapes such as a circular shape. However, in the case where a circular lighting unit 30 (light source 34) is used, an irradiation quantity of light at a point on the wafer W when the point passes through a diametric portion in a circular irradiation region and an irradiation quantity of light at the point when the point passes through a portion other than the diametric portion are different from each other. Therefore, in the case where the rectangular lighting unit 30 (light source 34) is used, the light may be more uniformly irradiated to the wafer W.

The pair of second side edges 34b may not have a linear shape, and may not follow the direction orthogonal to the extension direction of the opening portion 22. For example, the pair of second side edges 34b may have a circular arc shape. In this case, the curvature radius of the pair of the second side edges 34b may be substantially the same as the radius of the wafer W.

In the present exemplary embodiment, the lighting unit 30 irradiates UV light. However, the lighting unit 30 may irradiate any other light or energy ray. The technology according to the present disclosure may be widely applied to an apparatus that may uniformly irradiate a certain light or energy ray to a whole surface of, for example, a substrate.

In the present exemplary embodiment, the rotary holding unit 10 holds the wafer W substantially horizontally. However, it is not necessary for the wafer W to be always held horizontally in irradiation by the lighting unit 30. For example, the rotary holding unit 10 may hold the wafer W in a tilted state, or may hold the wafer W in a state where the rotary axis extends substantially horizontally. The rotary holding unit 10 may hold the wafer W such that the surface Wa of the wafer W is oriented downward. In this case, the lighting unit 30 is positioned below the wafer W, and the light shielding mask 20 is positioned between the wafer W and the lighting unit 30.

EXAMPLE

Hereinafter, the contents of the present disclosure will be described in more detail with reference to examples and comparative example. However, the present disclosure is not limited to the following examples.

Example 1

In Example 1, with the configuration of the light irradiation unit according to the present exemplary embodiment and based on the following conditions, an exposure quantity for a wafer was calculated through a simulation. In addition, the lighting unit was moved from a side edge to the center of the wafer on a straight line that passes through the center of the wafer.

Diameter of wafer: 300 mm
Number of revolutions of wafer: 60 rpm (fixed)
Opening portion of light shielding mask: a fan shape of which the central angle is set to 10°
Moving speed of lighting unit: 15 mm/sec (fixed)
Shape of lighting unit (light source): square shape (15 mm×15 mm)

Figure 11:
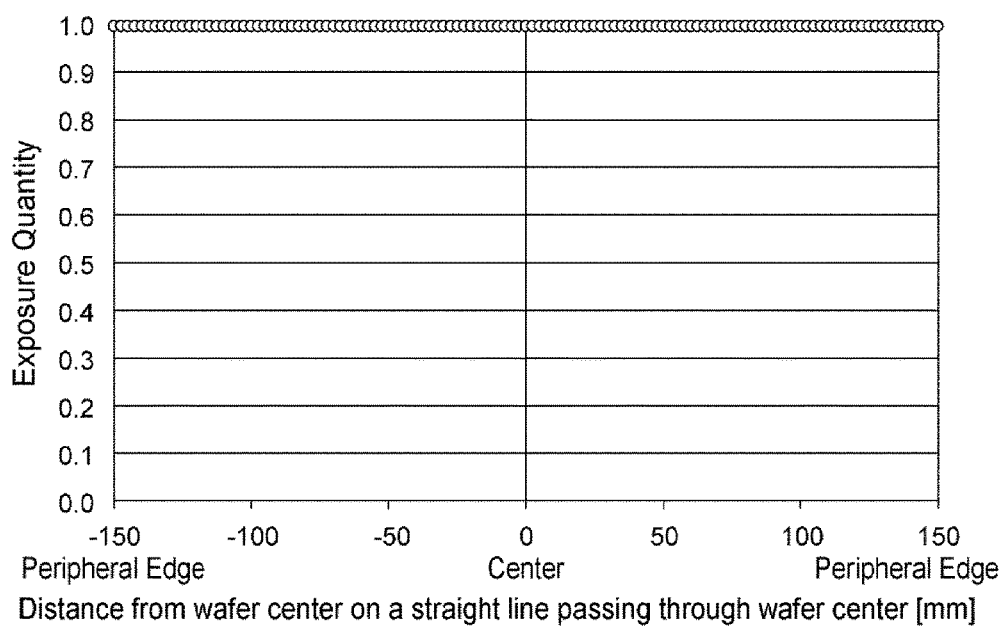
FIG. 11 is a view illustrating a simulation result according to Example 1.

A simulation result is represented in FIG. 11. FIG. 11 represents an exposure quantity of each point on a straight line that passes through the center of the wafer. The vertical axis of FIG. 11 is standardized by setting the largest exposure quantity to 1, and thus the minimum value is 0, and the maximum value is 1 (which is the same in FIGS. 12 and 13). As represented in FIG. 11, in Example 1, it was observed that exposure was uniformly performed to the whole wafer. In addition, in the whole surface of the wafer, the difference between the maximum value and the minimum value of the exposure quantity was 0, 3σ was 0, and % 3σ was 0%.

Comparative Example 1

In Comparative Example 1, with a configuration in which the light shielding mask was omitted in the components of the light irradiation unit according to the present exemplary embodiment and based on the following conditions, an exposure quantity for a wafer was calculated through a simulation. In addition, the lighting unit was moved from a side edge to the center of the wafer on a straight line that passes through the center of the wafer.
Diameter of wafer: 300 mm
Number of revolutions of wafer: 120 rpm (fixed)
Moving speed of lighting unit: 15 mm/sec (fixed)
Shape of lighting unit (light source): round shape (diameter 15 mm)

Figure 12A:
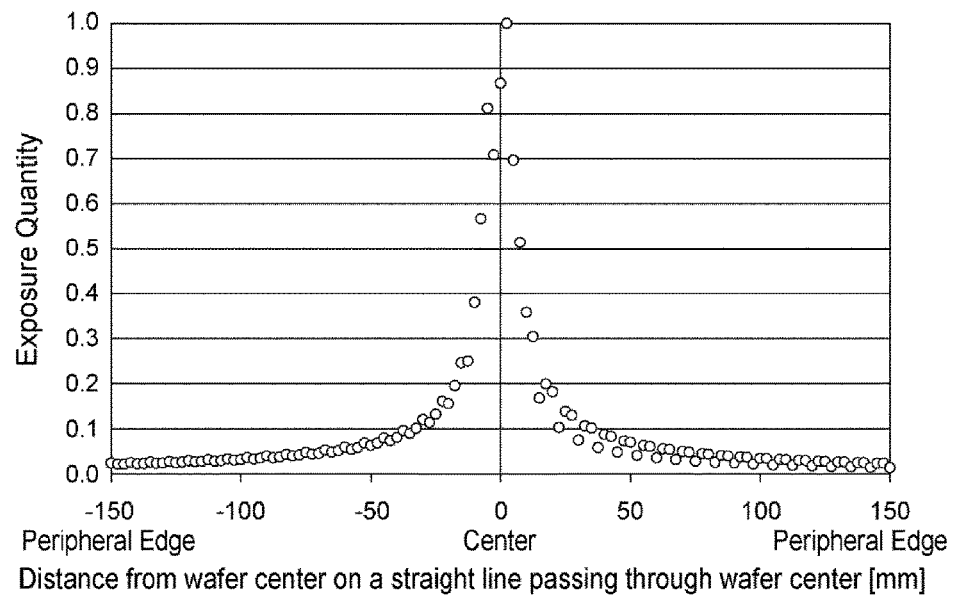
FIGS. 12A and 12B are views representing simulation results according to Comparative Examples 1 and 2, respectively.

A simulation result is represented in FIG. 12A. As represented in FIG. 12A, in Comparative Example 1, it was observed that the exposure quantity exponentially increased toward the center of the wafer. In addition, in the whole surface of the wafer, the difference between the maximum value and the minimum value of the exposure quantity was 0.9861, 3σ was 0.1509, and % 3σ was 347.9%.

Comparative Example 2

In Comparative Example 2, the conditions other than the moving speed of the lighting unit are set to be the same as Comparative Example 1, and an exposure quantity for a wafer was calculated through a simulation. As indicated in Table 1, the moving speed of the lighting unit was set to be increased every time when the lighting unit is moved by 7.5 mm

TABLE 1

| Step | Central Position of Irradiation Unit [mm] | Moving Speed of Irradiation Unit [mm/sec] |
|---|---|---|
| 1 | 165.0 → 157.5 | 1/0 |
| 2 | 157.5 → 150.0 | 1.05 |
| 3 | 150.0 → 142.5 | 1.10 |
| 4 | 142.5 → 135.0 | 1.16 |
| 5 | 135.0 → 127.5 | 1.23 |
| 6 | 127.5 → 120.0 | 1.30 |
| 7 | 120.0 → 112.5. | 1.39 |
| 8 | 112.5 → 105.0 | 1.48 |
| 9 | 105.0 → 97.5 | 1.59 |
| 10 | 97.5 → 90.0 | 1.72 |
| 11 | 90.0 → 82.5 | 1.87 |
| 12 | 82.5 → 75.0 | 2.05 |

TABLE 1-continued

| Step | Central Position of Irradiation Unit [mm] | Moving Speed of Irradiation Unit [mm/sec] |
|---|---|---|
| 13 | 75.0 → 67.5 | 2.26 |
| 14 | 67.5 → 60.0 | 2.53 |
| 15 | 60.0 → 52.5 | 2.87 |
| 16 | 52.5 → 45.0 | 3.31 |
| 17 | 45.0 → 37.5 | 3.91 |
| 18 | 37.5 → 30.0 | 4.78 |
| 19 | 30.0 → 22.5 | 6.14 |
| 20 | 22.5 → 15.0 | 8.60 |
| 21 | 15.0 → 7.5 | 14.33 |
| 22 | 7.5 → 0.0 | 43.0 |

Figure 12B:
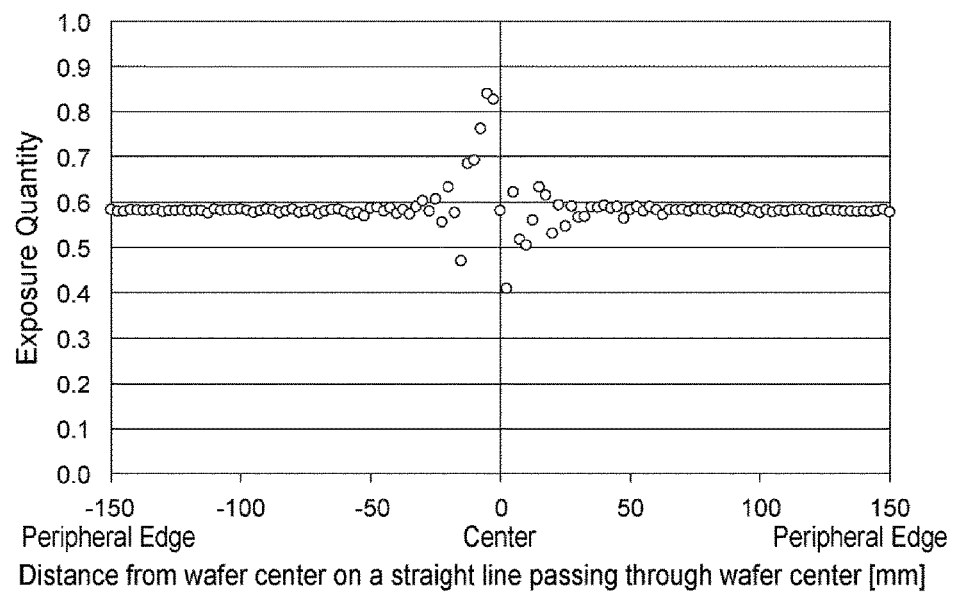

A simulation result is represented in FIG. 12B. As represented in FIG. 12B, while uniformity in exposure quantity in Comparative Example 2 was improved as compared to Comparative Example 1, a variation in exposure quantity was observed in the vicinity of the center of the wafer. In addition, in the whole surface of the wafer, the difference between the maximum value and the minimum value of the exposure quantity was 0.6442, 3σ was 0.0401, and %3σ was 6.9%.

Comparative Example 3

In Comparative Example 3, with a configuration in which the light shielding mask was omitted in the components of the light irradiation unit according to the present exemplary embodiment and based on the following conditions, an exposure quantity for a wafer was calculated through a simulation. In addition, the lighting unit was moved from a side edge to the center of the wafer on a straight line that passes through the center of the wafer.
Diameter of wafer: 300 mm
Number of revolutions of wafer: 120 rpm (fixed)
Moving speed of lighting unit: 15 mm/sec (fixed)
Shape of lighting unit (light source): square shape (30 mm×30 mm)

Figure 13A:
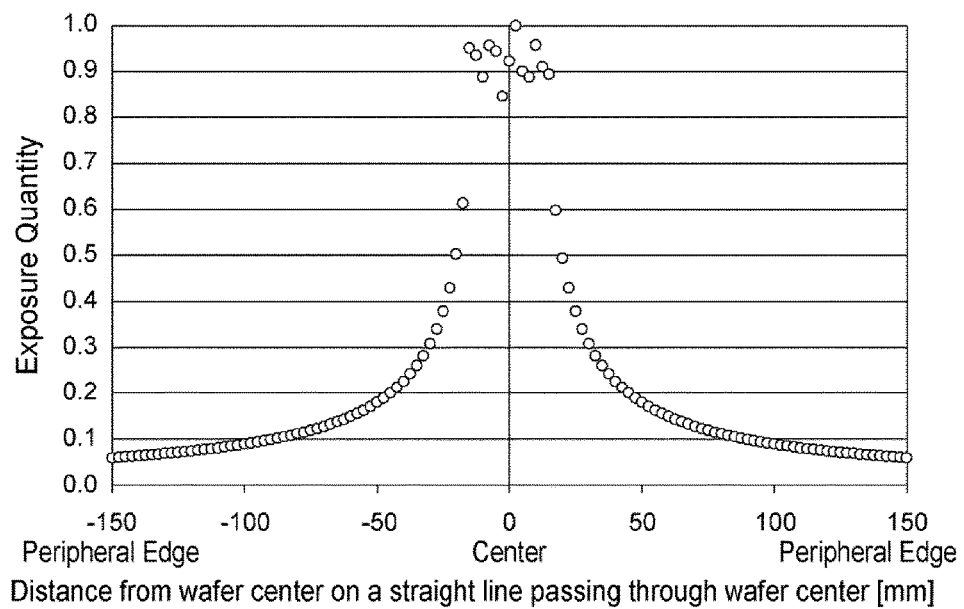
FIGS. 13A and 13B are views representing simulation results according to Comparative Examples 3 and 4, respectively.

A simulation result is represented in FIG. 13A. As represented in FIG. 13A, in Comparative Example 3, it was observed that the exposure quantity was exponentially improved toward the center of the wafer. In addition, in the whole surface of the wafer, the difference between the maximum value and the minimum value of the exposure quantity was 0.9413, 3σ was 0.3356, and % 3σ was 285.8%.

Comparative Example 4

In Comparative Example 4, the conditions other than the moving speed of the lighting unit were set to be the same as Comparative Example 3, and an exposure quantity for a wafer was calculated through a simulation. As indicated in Table 1, the moving speed of the lighting unit was set to be increased every time when the lighting unit is moved by 7.5 mm.

Figure 13B:
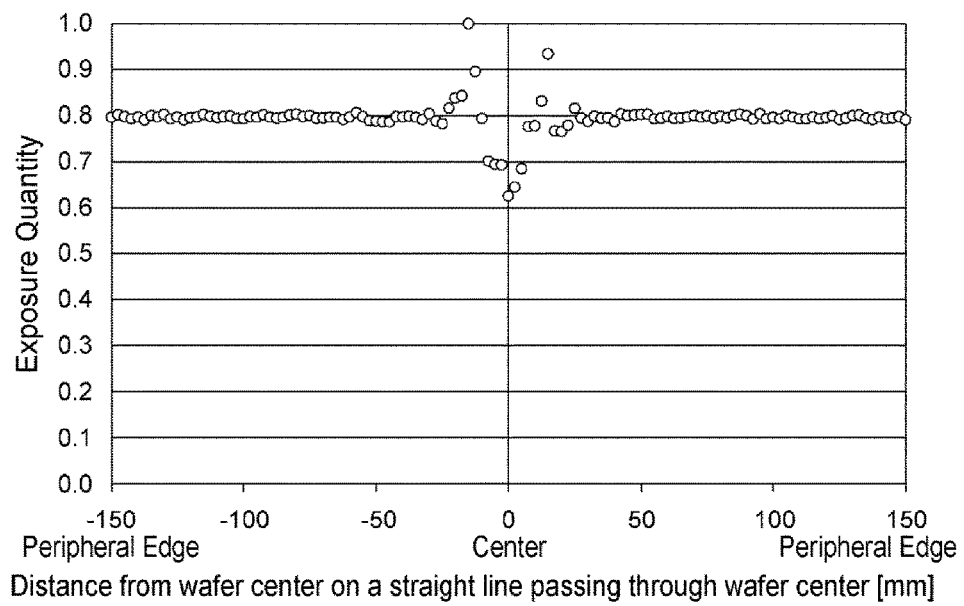

A simulation result is represented in FIG. 13B. As represented in FIG. 13B, while uniformity in exposure quantity in Comparative Example 4 was improved as compared to Comparative Example 3, a variation in exposure quantity was observed in the vicinity of the center of the wafer. In addition, in the whole surface of the wafer, the difference between the maximum value and the minimum value of the exposure quantity was 0.3902, 3σ was 0.0339, and % 3σ was 4.3%.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A light irradiation apparatus comprising:
a rotary holding unit configured to rotate a substrate around a rotary axis extending in a direction orthogonal to a surface of the substrate while holding the substrate;
a lighting unit positioned to face the rotary holding unit;
a light shielding mask positioned between the rotary holding unit and the lighting unit, and widened along a direction orthogonal to the rotary axis; and
a driving unit configured to linearly move the lighting unit along the direction orthogonal to the rotary axis,
wherein the light shielding mask overlaps with the substrate to cover the surface of the substrate held on the rotary holding unit, when viewed in the direction of the rotary axis,
the light shielding mask has an opening portion that extends toward an outside from the rotary axis in the direction orthogonal to the rotary axis, an opening width of the opening portion at a side away from the rotary axis being larger than the opening width near the rotary axis in the direction orthogonal to the rotary axis, and
the lighting unit irradiates light through the opening portion toward the surface of the substrate held on the rotary holding unit while being moved above the opening portion by the driving unit.

2. The light irradiation apparatus of claim 1, wherein, in the direction orthogonal to the rotary axis, the opening portion extends toward the outside from the rotary axis and is widened as going away from the rotary axis.

3. The light irradiation apparatus of claim 1, wherein the opening portion includes two sides extending from an intersection point between the mask and the rotary axis, and
the two sides are spaced away from each other as going away from the intersection point.

4. The light irradiation apparatus of claim 3, wherein the substrate has a circular shape, and the opening portion has a fan shape.

5. The light irradiation apparatus of claim 1, wherein the rotary holding unit rotates the substrate at a substantially constant rotating speed.

6. The light irradiation apparatus of claim 1, wherein the driving unit moves the lighting unit at a substantially constant speed.

7. The light irradiation apparatus of claim 1, wherein the lighting unit includes a rectangular flat light source, and
a pair of opposite side edges of the light source are orthogonal to an extension direction of the opening portion.

8. A light irradiation apparatus comprising:
a rotary holding unit configured to rotate a substrate around a rotary axis extending in a direction orthogonal to a surface of the substrate while holding the substrate;
a plurality of lighting units positioned to face the rotary holding unit; and
a light shielding mask positioned between the rotary holding unit and the plurality of lighting units, and widened along a direction orthogonal to the rotary axis,
wherein the light shielding mask overlaps with the substrate to cover the surface of the substrate held on the rotary holding unit, when viewed in the direction of the rotary axis,
the light shielding mask has an opening portion that extends toward an outside from the rotary axis in the direction orthogonal to the rotary axis, an opening width of the opening portion at a side away from the rotary axis being larger than that near the rotary axis in the direction orthogonal to the rotary axis, and
the plurality of lighting units are arranged above the opening portion so that the opening portion is wholly covered by the plurality of lighting units, each of the lighting units irradiating light through the opening portion toward the surface of the substrate held on the rotary holding unit.

* * * * *